United States Patent
He et al.

(10) Patent No.: US 11,716,063 B2
(45) Date of Patent: Aug. 1, 2023

(54) METHOD AND APPARATUS FOR PLAYING AUDIO, AND COMPUTER-READABLE STORAGE

(71) Applicant: SHENZHEN GRANDSUN ELECTRONIC CO., LTD., Guangdong (CN)

(72) Inventors: Guixiao He, Guangdong (CN); Qingxue Zhang, Guangdong (CN); Jiugao Peng, Guangdong (CN); Shiwen Guo, Guangdong (CN); Lei Cao, Guangdong (CN); Haiquan Wu, Guangdong (CN)

(73) Assignee: SHENZHEN GRANDSUN ELECTRONIC CO., LTD., Guangdong (CN)

( * ) Notice: Subject to any disclaimer, the term of this patent is extended or adjusted under 35 U.S.C. 154(b) by 0 days.

(21) Appl. No.: 17/554,917

(22) Filed: Dec. 17, 2021

(65) Prior Publication Data
US 2023/0032398 A1    Feb. 2, 2023

(30) Foreign Application Priority Data
Jul. 27, 2021  (CN) ......................... 202110849250.2

(51) Int. Cl.
*H03G 3/32*  (2006.01)
*H03G 3/30*  (2006.01)
*H03G 5/16*  (2006.01)

(52) U.S. Cl.
CPC ............. *H03G 3/32* (2013.01); *H03G 3/3042* (2013.01); *H03G 3/3089* (2013.01); *H03G 5/165* (2013.01)

(58) Field of Classification Search
CPC ...... H03G 3/32; H03G 3/3042; H03G 3/3089; H03G 5/165; H03G 5/00; H03G 5/025; H04R 29/00–007
USPC ...................... 381/56–59, 104–109
See application file for complete search history.

(56) References Cited

U.S. PATENT DOCUMENTS

| | | | |
|---|---|---|---|
| 4,479,237 A * | 10/1984 | Sugasawa ................ | H03G 3/32 |
| | | | 381/57 |
| 9,622,004 B2 * | 4/2017 | Matsumoto ............ | H04R 1/406 |
| 9,728,204 B2 * | 8/2017 | Song ........................ | G10L 21/10 |
| 10,594,284 B2 * | 3/2020 | Goldstein ............ | H04N 7/0885 |

(Continued)

*Primary Examiner* — Xu Mei
(74) *Attorney, Agent, or Firm* — Christensen O'Connor Johnson Kindness PLLC

(57) ABSTRACT

The present application relates to the field of audio technology, and provides a method, a device, and an apparatus for playing audio, and a computer-readable storage medium. The method for playing audio includes: obtaining an ambient atmospheric pressure value and audio data to be played; obtaining multiple target frequency points contained in the audio data to be played when the ambient atmospheric pressure value meets a preset condition, and determining equal-loudness multiples corresponding to the target frequency points according to the ambient atmospheric pressure value and a preset calibration atmospheric pressure value; and sending the audio data to be played and the equal-loudness multiples of the target frequency points to a power amplifying module, such that the power amplifying module amplifies the audio data to be played according to the equal-loudness multiples corresponding to the target frequency points.

18 Claims, 3 Drawing Sheets

(56) References Cited

U.S. PATENT DOCUMENTS

| | | | |
|---|---|---|---|
| 2010/0074450 A1* | 3/2010 | Liao | H03G 3/32 |
| | | | 381/104 |
| 2014/0369512 A1* | 12/2014 | Slupeiks | H04R 3/00 |
| | | | 381/59 |

* cited by examiner

METHOD AND APPARATUS FOR PLAYING AUDIO, AND COMPUTER-READABLE STORAGE

CROSS-REFERENCE TO RELATED APPLICATION

The present application claims priority of Chinese Patent with Application No. 202110849250.2, filed on Jul. 27, 2021; the content of which is incorporated herein by reference.

TECHNICAL FIELD

The present application relates to the field of audio technology, and more particularly to a method and an apparatus for playing audio, and a computer-readable storage medium.

BACKGROUND

The apparatus for playing audio is used to play audio data, and the apparatus for playing audio includes, but is not limited to, earphones, speakers, etc. In actual applications, apparatus for playing audio may be used in a variety of environments. For example, apparatus for playing audio may be used in plain areas, or in plateau areas (such as the Qinghai-Tibet Plateau), and in extreme cases, it may also be used in the deep sea.

However, the inventor found that when the apparatus for playing audio in the related art is used in some special environments, the sound output by the audio data playing is too loud or too small, which causes discomfort to human ears.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The present application provides a method and an apparatus for playing audio, and a computer-readable storage medium, in order to solve the technical problem that the output sound of the audio playing device in the related technology is too loud or too small when used in a special environment.

In a first aspect, an embodiment of the present application provides a method for playing audio, which includes:

obtaining an ambient atmospheric pressure value and audio data to be played;

obtaining multiple target frequency points contained in the audio data to be played when the ambient atmospheric pressure value meets a preset condition, and determining equal-loudness multiples corresponding to the target frequency points according to the ambient atmospheric pressure value and a preset calibration atmospheric pressure value; and sending the audio data to be played and the equal-loudness multiples of the target frequency points to a power amplifying module, such that the power amplifying module amplifies the audio data to be played according to the equal-loudness multiples corresponding to the target frequency points.

In a possible implementation of the first aspect, the step of determining equal-loudness multiples corresponding to the target frequency points according to the ambient atmospheric pressure value and a preset calibration atmospheric pressure value includes:

obtaining a target frequency response multiple relationship according to the ambient atmospheric pressure value, the target frequency response multiple relationship being configured for representing an one-to-one correspondence relationship between multiple preset frequency points and multiple equal-loudness multiples under a target atmospheric pressure value, wherein each equal-loudness multiple refers to a multiple value of loudness of audio at the preset frequency point under the target atmospheric pressure value and loudness of audio at the preset frequency point under the preset calibration atmospheric pressure value; and determining an equal-response multiple corresponding to each of the target frequency points according to the target frequency response multiple relationship.

In a possible implementation of the first aspect, the step of obtaining a target frequency response multiple relationship according to the ambient atmospheric pressure value includes:

obtaining frequency response multiple relationships under multiple preset atmospheric pressure values, respectively; and determining a preset atmospheric pressure value with a smallest difference between the multiple preset atmospheric pressure values and the ambient atmospheric pressure value as the target atmospheric pressure value, and determining a frequency response multiple relationship under the target atmospheric pressure value as the target frequency response multiple relationship.

In a possible implementation of the first aspect, the step of determining an equal-response multiple corresponding to each of the target frequency points according to the target frequency response multiple relationship includes:

determining a frequency point with a smallest difference between the multiple preset frequency points and a first target frequency point as an equivalent frequency point, and determining an equal-loudness multiple corresponding to the equivalent frequency point as an equal-loudness multiple corresponding to the first target frequency point, wherein the first target frequency point is any one of the multiple target frequency points.

In a possible implementation of the first aspect, the step of obtaining multiple target frequency points contained in the audio data to be played includes:

performing Fourier transform processing on the audio data to be played to obtain audio frequency domain data; and determining multiple target frequency points contained in the audio data to be played according to the audio frequency domain data.

In a possible implementation of the first aspect, the preset condition is that the ambient atmospheric pressure value is greater than a first preset atmospheric pressure value or less than a second preset atmospheric pressure value, wherein, the first preset atmospheric pressure value is greater than the preset calibration atmospheric pressure value, and the second preset atmospheric pressure value is less than the preset calibration atmospheric pressure value.

In a possible implementation of the first aspect, the preset calibration atmospheric pressure value is a standard atmospheric pressure value.

In a second aspect, an embodiment of the present application provides a device for playing audio, which includes:

an obtaining module, configured for obtaining an ambient atmospheric pressure value and audio data to be played;

a determining module, configured for obtaining multiple target frequency points contained in the audio data to be played when the ambient atmospheric pressure value meets a preset condition, and determining equal-loudness multiples corresponding to the target frequency points according to the ambient atmospheric pressure value and a preset calibration atmospheric pressure value; and a sending module, configured for sending the audio data to be played and the equal-loudness multiples of the target frequency points to a power amplifying module, such that the power amplifying module amplifies the audio data to be played according to the equal-loudness multiples corresponding to the target frequency points.

In a third aspect, an embodiment of the present application provides an apparatus for playing audio, which includes a memory, a processor, and a computer program stored in the memory and capable of running on the processor, and when the processor executes the computer program, the method for playing audio of the first aspect is implemented.

In a fourth aspect, an embodiment of the present application provides a computer-readable storage medium, the computer-readable storage medium stores a computer program, and the computer program implements the method for playing audio of the first aspect when the computer program is executed by a processor.

In the method, the device, and the apparatus for playing audio, and the computer-readable storage medium provided by the present application, by obtaining the ambient atmospheric pressure value and the audio data to be played, and obtaining the multiple target frequency points contained in the audio data to be played when the ambient atmospheric pressure value meets the preset condition, and determining the equal-loudness multiples corresponding to the target frequency points according to the ambient atmospheric pressure value and the preset calibration atmospheric pressure value. Sending the audio data to be played and the equal-loudness multiples of the target frequency points to a power amplifying module, such that the power amplifying module amplifies the audio data to be played according to the equal-loudness multiples corresponding to the target frequency points. The method, the device, and the apparatus for playing audio, and the computer-readable storage medium provided by the present application can process the apparatus for playing audio in a special environment such as high atmospheric pressure or low atmospheric pressure, and amplify various frequency points of the played audio data in combination with the ambient atmospheric pressure value around the apparatus for playing audio and the preset calibration atmospheric pressure value, to realize the adjustment of the sound pressure of the sound, so that the sound pressure of the output sound is similar to the sound pressure under the preset calibration atmospheric pressure value, thereby avoiding the sound being too loud or too small, the audio playing effect is improved to avoid discomfort to human ears. In addition, the method, the device, and the apparatus for playing audio, and the computer-readable storage medium provided by the present application enable the apparatus for playing audio to be used in various environments, and improve the applicability and practicability of the apparatus for playing audio.

DESCRIPTION OF THE DRAWINGS

In order to explain the embodiments of the present application more clearly, a brief introduction regarding the accompanying drawings that need to be used for describing the embodiments of the present application or the prior art is given below; it is obvious that the accompanying drawings described as follows are only some embodiments of the present application, for those skilled in the art, other drawings can also be obtained according to the current drawings on the premise of paying no creative labor.

DETAILED DESCRIPTION

While illustrative embodiments have been illustrated and described, it will be appreciated that various changes can be made therein without departing from the spirit and scope of the invention.

In order to make the objectives, technical solutions, and advantages of the present application clearer, the following further describes the present application in detail with reference to the accompanying drawings and embodiments. It should be understood that the specific embodiments described here are only used to explain the present application, and are not used to limit the present application.

It can be understood that the terms "first", "second", "third", "fourth", etc. (if any) in the embodiments of the present application are used to distinguish similar objects and are not necessarily used to describe a specific sequence or precedence.

It can be understood that the term "and/or" used in the present application refers to any combination of one or more of the items listed in association and all possible combinations and includes these combinations.

The apparatus for playing audio is an electronic apparatus commonly used in the daily life and work of people and is mainly used to play audio data. In use, it is found that the apparatus for playing audio is used in different environments, and the output sound is different. For example, in different environments such as deep seas, plateaus, plains, thin atmospheric environments, and negative pressure medical rooms, the audio output through the apparatus for playing audio may be large or small. In this way, the sound of the apparatus for playing audio is too low when used in some environments, resulting in the user's inaudible or inaudible sound, and while being used in some environments, the sound is too loud, which may damage human ears. Therefore, it is necessary to design an apparatus for playing audio or a method or playing audio that can be adapted to various environments.

The inventor found that in different environments, the output sound of the apparatus for playing audio is different, mainly due to the difference in the atmospheric pressure value. Since sound is also a kind of pressure and the transmission of sound is affected by the value of atmospheric pressure. For the same audio, under different atmospheric pressure values, there are differences in sound pressure, so the output sound levels are different. Based on this, the embodiments of the present application provide a method for playing audio and an apparatus for playing audio, in order to adjust the sound pressure of audio in different atmospheric pressure environments, so that the sound output of the apparatus for playing audio in various environments is approximately the same, so that the apparatus for playing audio can be used in various environments.

Figure 1:
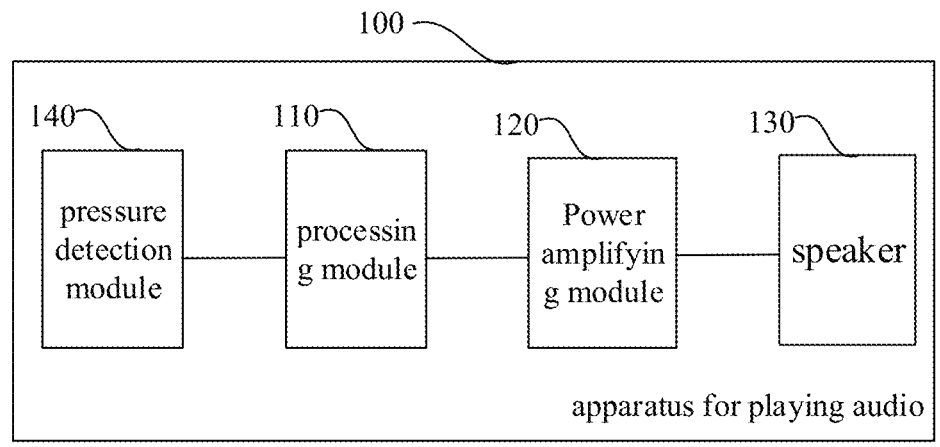
FIG. 1 is a schematic structural diagram of an apparatus for playing audio provided by an embodiment of the present application.

FIG. 1 is a schematic structural diagram of an apparatus for playing audio applicable to the present application. As shown in FIG. 1, the apparatus for playing audio 100 may include a processing module 110, a power amplifying module 120, a speaker 130, and a pressure detection module 140. The processing module 110 is electrically connected to the power amplifying module 120 and the pressure detection module 140 respectively, and the power amplifying module 120 is electrically connected to the speaker 130. The processing module 110 is configured to process audio data and other data, and to send them to the power amplifying module 120. The power amplifying module 120 is used for power amplifying the audio data. The speaker 130 is used for playing the amplified audio data. The pressure detection module 140 is used for detecting pressure, including but not limited to ambient atmospheric pressure. Optionally, the processing module 110 may be a chip. The processing module 110 may include a processor and a memory. The memory can store a computer program. The processor is electrically connected to the memory and can run the computer program. Optionally, the power amplifying module 120 may include a power amplification chip or circuits related to power amplifying.

It can be understood that, in addition to the module structure shown in FIG. 1, the apparatus for playing audio 100 may also include other modules, such as a memory, a noise reduction module, and so on, which is not limited herein the present application.

Optionally, the above-mentioned apparatus for playing audio 100 may be a headset, a loudspeaker box (also referred to as a speaker), a microphone, or a loudspeaker, or a module for playing audio inside the electronic device. The headset may be a wired headset or a wireless headset (for example, a Bluetooth headset). The speaker can be the main speaker, monitor speaker, or return speaker. The embodiment of the present application does not make any limitation on the type, model, etc. of the audio playback device 100.

The technical solutions in this application will be described in detail below in conjunction with the accompanying drawings. It should be noted that, in the case of no conflict, different technical features in this application can be combined with each other.

Figure 2:
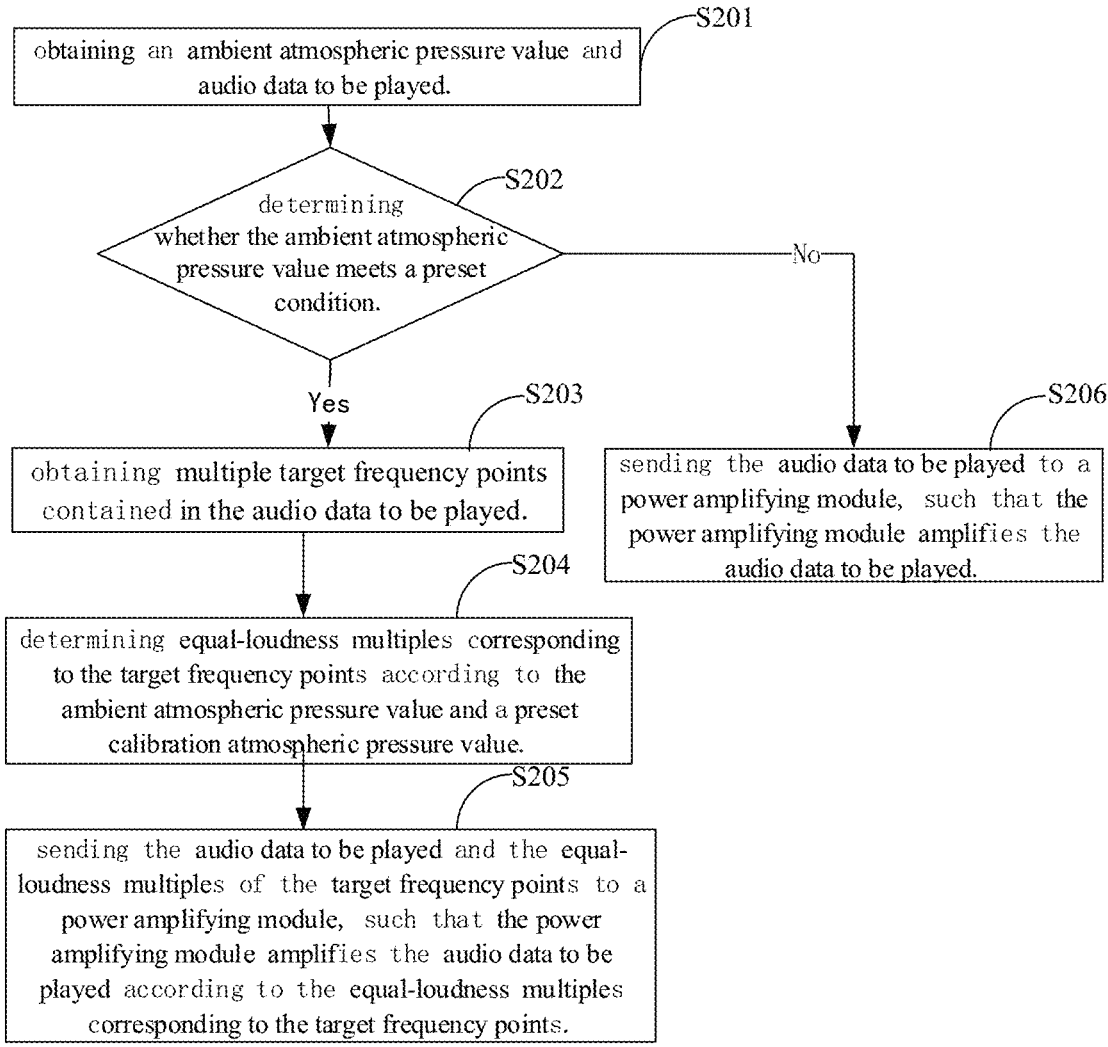
FIG. 2 is a schematic flowchart of a method for playing audio provided by an embodiment of the present application.

FIG. 2 shows a schematic flowchart of the audio playback method provided by the present application. In this embodiment, the audio playback method is applied to the audio playback device shown in FIG. 1. Specifically, the method is applied to the processing module as an example for description. As shown in FIG. 2, the audio playback method provided in this embodiment may include:

S201: obtaining an ambient atmospheric pressure value and audio data to be played.

The ambient atmospheric pressure value is used to characterize the atmospheric pressure value of the environment where the apparatus to be played is currently located. Optionally, the apparatus for playing audio can detect the ambient atmospheric pressure value through the pressure detection module. The pressure detection module can directly send the ambient atmospheric pressure value to the processing module or store the detected ambient atmospheric pressure value in the memory, and the processing module can obtain the detected ambient atmospheric pressure value from the memory when needed, which is not limited herein the present application.

The audio data to be played refers to the audio data to be played by the apparatus for playing audio. Optionally, the processing module may obtain the audio data to be played from the buffer of the apparatus for playing audio. Optionally, the audio data to be played may be separate audio data or may be audio data included in the video data, which is not limited herein the present application.

S202: determining whether the ambient atmospheric pressure value meets a preset condition.

Optionally, the preset condition may be that the ambient atmospheric pressure value is greater than the first preset atmospheric pressure value. Optionally, the preset condition may also be that the ambient atmospheric pressure value is less than the second preset atmospheric pressure value. Optionally, the preset condition may also be that the ambient atmospheric pressure value is greater than the first preset atmospheric pressure value or less than the second preset atmospheric pressure value.

Among them, the specific values of the first preset atmospheric pressure value and the second preset atmospheric pressure value can be selected according to actual needs. In one embodiment, the first preset atmospheric pressure value is greater than the preset calibration atmospheric pressure value, and the second preset atmospheric pressure value is less than the preset calibration atmospheric pressure value. The preset calibration atmospheric pressure value may be, for example, a standard atmospheric pressure value, that is, $1.01325 \times 10^5$ Pa. Correspondingly, the first preset atmospheric pressure value may be, for example, 3 standard atmospheric pressure values, that is, $3.03975 \times 10^5$ Pa, and the second preset atmospheric pressure value may be, for example, $1.013 \times 10^5$ Pa. When the preset calibrated atmospheric pressure value is the standard atmospheric pressure value, the ambient atmospheric pressure value is greater than the first preset atmospheric pressure value, that is: the apparatus for playing audio is in a high atmospheric pressure environment (that is, a positive pressure environment); the ambient atmospheric pressure value is less than the second preset atmospheric pressure value, That is, the apparatus for playing audio is in a low atmospheric pressure environment (that is, a negative pressure environment); the ambient atmospheric pressure value is greater than the first preset atmospheric pressure value or less than the second preset atmospheric pressure value, that is, the apparatus for playing audio is in a high atmospheric pressure environment or a low atmospheric pressure environment.

It can be understood that the preset condition is that when the ambient atmospheric pressure value is greater than the first preset atmospheric pressure value or less than the second preset atmospheric pressure value, and when the ambient is in high atmospheric pressure or low atmospheric pressure, the preset conditions are all satisfied. The preset conditions can cover both high atmospheric pressure and low atmospheric pressure environments, such that the applicability of the apparatus for playing audio is stronger.

If the ambient atmospheric pressure value meets the preset condition, execute steps S203 to S205;

If the ambient atmospheric pressure value does not meet the preset condition, execute step S206.

S203: obtaining multiple target frequency points contained in the audio data to be played.

It can be understood that each audio data to be played contains multiple frequency points. The frequency point can also be called frequency. The frequency points contained in the audio data to be played is named the target frequency points.

S204: determining equal-loudness multiples corresponding to the target frequency points according to the ambient atmospheric pressure value and a preset calibration atmospheric pressure value.

In the embodiment, when amplifying the audio data to be played, different target frequency points are amplified by using different equal-loudness multiples. At the same time, for the same target frequency point, under different ambient atmospheric pressure values, the equal-response multiples of the target frequency point are also different. Among them, the equal-loudness multiple is used to represent the multiple relationship between the loudness of the audio under the ambient atmospheric pressure value and the loudness of the audio under the preset calibration atmospheric pressure value.

Specifically, the equal-loudness multiples corresponding to multiple frequency points under different atmospheric pressure values may be stored in the memory in advance. After obtaining multiple target frequency points contained in the audio data to be played, the processing module determines the equal-response multiple corresponding to each target frequency point under the ambient atmospheric pressure value according to the acquired ambient atmospheric pressure value.

S205: sending the audio data to be played and the equal-loudness multiples of the target frequency points to a power amplifying module, such that the power amplifying module amplifies the audio data to be played according to the equal-loudness multiples corresponding to the target frequency points.

Optionally, the processing module may convert the audio data to be played into an electrical signal and send the electrical signal to the power amplifying module. The processing module sends the equal-loudness multiple corresponding to each target frequency point to the power amplifying module. The power amplifying module amplifies the loudness of each target frequency point of the audio data to be played by a corresponding equal-loudness multiple according to the equal-loudness multiple, and sends the amplified signal to the loudspeaker, and outputs the sound through the loudspeaker, thereby realizing the adjustment of the sound pressure.

It can be understood that in the present embodiment, according to the difference between the ambient atmospheric pressure value and the preset calibration atmospheric pressure value, the equal-loudness multiple may be a value greater than 1, or any value between 0-1. Specifically, when the ambient atmospheric pressure value is greater than the preset calibration atmospheric pressure value, the equal-loudness multiple is a value greater than 1, and the power amplifier module amplifies the power of the audio data to be played, and the sound pressure of the sound output by the loudspeaker is increased; when the ambient atmospheric pressure value is less than the preset calibrated atmospheric pressure value, and the equal-loudness multiple is a value between 0-1, the power amplifying module reduces the power of the audio data to be played, and the sound pressure of the sound output by the speaker is reduced.

In addition, it can be understood that the power amplifying module also needs to consider the default amplification multiple, the volume parameter arranged by the user, etc., for the amplification of the audio data to be played. Optionally, the power amplifying module may amplify the audio data to be played according to the default amplification multiple, the volume parameter, and equal-loudness multiple of each frequency point mentioned above.

S206: sending the audio data to be played to a power amplifying module, such that the power amplifying module amplifies the audio data to be played.

If the ambient atmospheric pressure value does not meet the preset condition, the processing module directly sends the audio data to be played to the power amplifying module, and the power amplifying module only amplifies the audio data to be played according to the default amplification multiple, the volume parameter, etc., without considering equal-loudness multiple of each frequency point.

In the embodiment, by obtaining the ambient atmospheric pressure value and the audio data to be played and obtaining the multiple target frequency points contained in the audio data to be played when the ambient atmospheric pressure value meets the preset condition and determining the equal-loudness multiples corresponding to the target frequency points according to the ambient atmospheric pressure value and the preset calibration atmospheric pressure value. Sending the audio data to be played and the equal-loudness multiples of the target frequency points to a power amplifying module, such that the power amplifying module amplifies the audio data to be played according to the equal-loudness multiples corresponding to the target frequency points. The method provided by the embodiment can process the apparatus for playing audio in a special environment such as high atmospheric pressure or low atmospheric pressure, and amplify various frequency points of the played audio data in combination with the ambient atmospheric pressure value around the apparatus for playing audio and the preset calibration atmospheric pressure value, to realize the adjustment of the sound pressure of the sound, so that the sound pressure of the output sound is similar to the sound pressure under the preset calibration atmospheric pressure value, thereby avoiding the sound being too loud or too small, the audio playing effect is improved to avoid discomfort to human ears. In addition, the method provided by the embodiment enable the apparatus for playing audio to be used in various environments and improve the applicability and practicability of the apparatus for playing audio.

In an embodiment, in above step S203, obtaining multiple target frequency points contained in the audio data to be played includes:

performing Fourier transform processing on the audio data to be played to obtain audio frequency domain data; and determining multiple target frequency points contained in the audio data to be played according to the audio frequency domain data.

Figure 3:
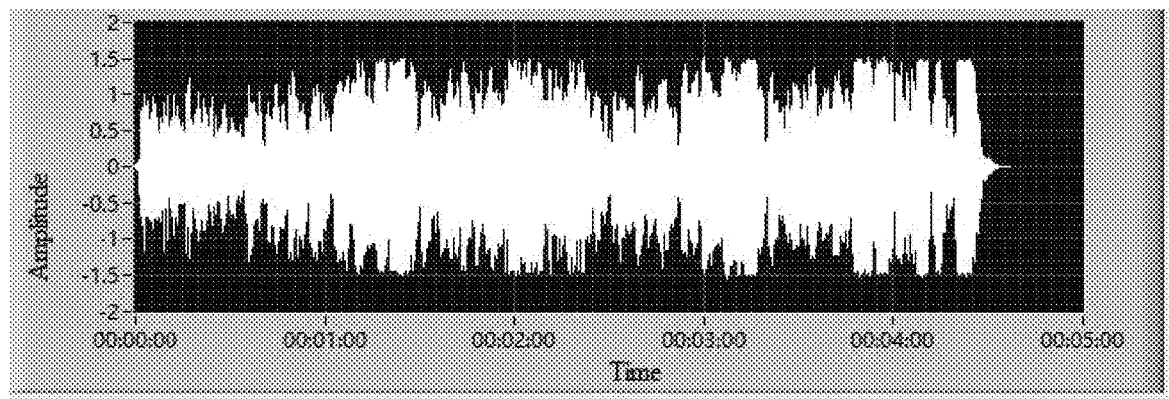
FIG. 3 is a time-domain curve diagram of audio to be played provided by an embodiment of the present application.
Figure 4:
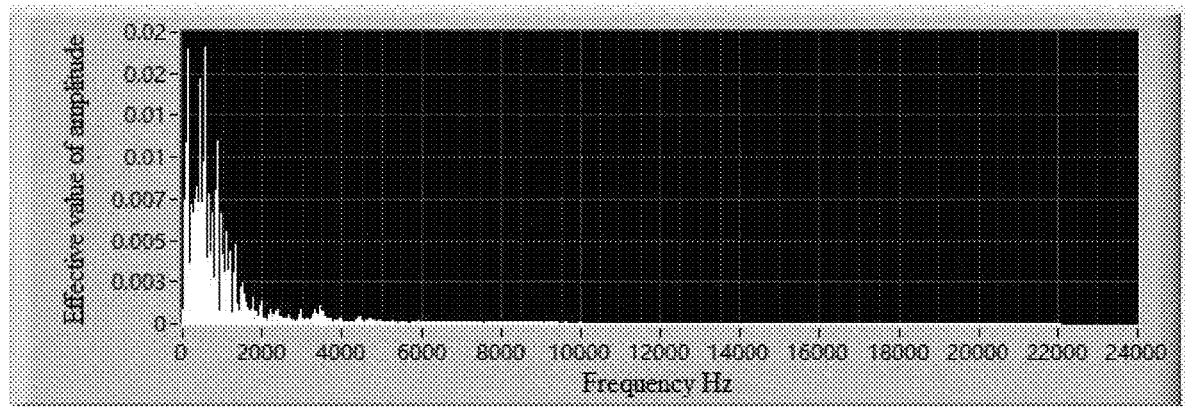
FIG. 4 is a frequency response curve graph of audio to be played under 10 standard atmospheric pressure values provided by an embodiment of the present application.

It can be understood that the audio data to be played may be time-domain data. Exemplarily, FIG. 3 is a time-domain curve diagram of audio data to be played provided by an embodiment of the present application. Specifically, FIG. 3 shows the time-domain curve of the song "I Love You China" under 10 standard atmospheric pressure values (about 1 MPa). In FIG. 3, the abscissa represents time, the ordinate represents amplitude, and the unit is V. After performing Fourier transform processing on the audio data to be played, the frequency domain data of the audio data to be played is obtained, which is named audio frequency domain data. According to the audio frequency domain data, the frequency point contained in the audio data to be played can be determined, that is, the target frequency point. Exemplarily, FIG. 4 is a frequency domain curve diagram corresponding to the audio data to be played shown in FIG. 3. That is, shown in FIG. 4 is the frequency response curve diagram of the audio to be played under 10 standard atmospheric pressure values. From FIG. 4, multiple target frequency points contained in the audio data to be played can be determined, for example, 2000 Hz.

In the implementation manner, the multiple target frequency points contained in the audio data to be played can be obtained simply, quickly and accurately through Fourier transform processing, thereby improving calculation efficiency.

In an embodiment, in above step S204, determining equal-loudness multiples corresponding to the target frequency points according to the ambient atmospheric pressure value and a preset calibration atmospheric pressure value includes:

obtaining a target frequency response multiple relationship according to the ambient atmospheric pressure value; and determining equal-loudness multiples corresponding to the target frequency points according to the target frequency response multiple relationship.

Among them, the target frequency response multiple relationship is configured for representing the one-to-one correspondence relationship between multiple preset frequency points and multiple equal-loudness multiples under a target atmospheric pressure value. Each equal-loudness multiple refers to a multiple value of loudness of audio at the preset frequency point under the target atmospheric pressure value and loudness of audio at the preset frequency point under the preset calibration atmospheric pressure value.

In the implementation manner, obtaining the target frequency response multiple relationship according to the ambient atmospheric pressure value, and determining an equal-response multiple corresponding to each of the target frequency points according to the target frequency response multiple relationship, the equal-response multiple being the multiple value of loudness of audio at the preset frequency point under the target atmospheric pressure value and loudness of audio at the preset frequency point under the preset calibration atmospheric pressure value. Therefore, after amplifying the audio data to be played with the equal-loudness multiple, the amplified audio can be made almost equal loudness with the audio under the preset calibration atmospheric pressure value, which can effectively adjust the sound pressure, improve the audio playing effect, and avoid causing discomfort to human ears.

As described above, the frequency response multiple relationships under multiple preset atmospheric pressure values can be stored in the memory in advance. That is, the corresponding relationships between multiple preset frequency points and equal-loudness multiples under different atmospheric pressure values are stored. For example, the corresponding relationship between multiple preset frequency points and equal-loudness multiples under 70 kPa, 80 kPa, 90 kPa, 110 kPa, 120 kPa, 130 kPa . . . can be stored in advance.

Optionally, after obtaining the current ambient atmospheric pressure value, one of the multiple preset atmospheric pressure values that is closest to the ambient atmospheric pressure value is determined as the target atmospheric pressure value. The frequency response multiple relationship corresponding to the target atmospheric pressure value is determined as the target frequency response multiple relationship. For example, when the apparatus for playing audio is applied to a place on the Qinghai-Tibet Plateau, the current ambient atmospheric pressure value is 84.5 kPa, then 80 kPa is determined as the target atmospheric pressure value, and the frequency response multiple relationship at 80 kPa is determined as the target frequency response multiple relationship, and determining the equal-loudness multiple corresponding to each target frequency point according to the relationship of the frequency response multiple under 80 kPa.

In the implementation manner, the atmospheric pressure value closest to the ambient atmospheric pressure value among the plurality of preset atmospheric pressure values is determined as the target atmospheric pressure value, and then the target frequency response multiple relationship is determined. In this way, the target frequency response multiple relationship can be determined from a limited number of frequency response multiple relationships, and the determined frequency response multiple relationship is closest to the ambient atmospheric pressure value, so that the equal-loudness multiple selected when the audio data to be played is amplified is more accurate, the audio playing effect is improved.

Each frequency response multiple relationship includes a corresponding relationship between multiple preset frequency points and the equal-loudness multiples. The preset frequency points can be preset according to requirements. For example, ⅙ octave frequency points from 20 Hz to 20000 Hz can be set as the preset frequency points, that is, the preset frequency points include 20 Hz, 40 Hz, 80 Hz, 160 Hz, 320 Hz . . . 20000 Hz. Of course, according to requirements, the ½, ¼, ⅛, or 1/16 octave frequency points of 20 Hz to 20000 Hz can also be set as the preset frequency points, which is not limited herein the embodiment of the present application.

The equal loudness multiple corresponding to each preset frequency point represents the multiple value of the loudness of the audio at the preset frequency point under the corresponding atmospheric pressure value and the loudness of the audio at the preset frequency point under the preset calibration atmospheric pressure value. Among them, loudness is also called range, amplitude or gain, etc., and the unit can be dB. For example, the equal-loudness multiple corresponding to the frequency point of 40 Hz at 80 kPa is the multiple relationship between the loudness of the audio at 40 Hz at 80 kPa and the loudness of the audio at 40 Hz at the standard atmospheric pressure. Assuming that the loudness of the audio of 40 Hz at 80 kPa is X dB, and the loudness of the audio of 40 Hz at the standard atmospheric pressure is AX dB, then the equal-loudness multiple corresponding to the frequency point of 40 Hz at 80 kPa is X/AX=1/A.

Optionally, the frequency response multiple relationship at each preset atmospheric pressure value can be obtained through the following process:

1) Through experiments to detect the loudness of the audio at each preset frequency point under the preset calibration atmospheric pressure value.

For example, when the preset calibration atmospheric pressure value is the standard atmospheric pressure value, ⅙ octave frequency points from 20 Hz to 20000 Hz are detected: the loudness of the audio of 20 Hz, 40 Hz, 80 Hz, 160 Hz, 320 Hz . . . 20000 Hz are respectively x1, x2, x3 . . . xn, and the corresponding frequency and loudness function is $f(x)=x_1 20+x_2 40+x_3 80+ \ldots +x_n 20000$.

2) Through experiments to detect the loudness of the audio at each preset frequency point under each preset atmospheric pressure value.

For example, at 70 kPa, the ⅙ octave frequency points from 20 Hz to 20000 Hz are detected: the loudness of the audio of 20 Hz, 40 Hz, 80 Hz, 160 Hz, 320 Hz . . . 20000 Hz are respectively $a_1x_1, a_2x_2, a_3x_3 \ldots a_nx_n$, and the corresponding frequency and loudness function is f $(x)=a_1x_120+a_2x_240+a_3x_380+ \ldots +a_nx_n20000$.

At 80 kPa, the ⅙ octave frequency points from 20 Hz to 20000 Hz are detected: the loudness of the audio are respectively $b_1x_1, b_2x_2, b_3x_3 \ldots b_nx_n$, and the corresponding frequency and loudness function is f $(x)=b_1x_120+b_2x_240+b_3x_380+ \ldots +b_nx_n20000$ The following will not be listed.

3) Calculating respectively the loudness of the audio of each preset frequency point under a preset atmospheric pressure value and the loudness multiple value under the preset standard atmospheric pressure value, to obtain the equal-loudness multiple of each preset frequency point under the preset atmospheric pressure value, and then to obtain the frequency response multiple relationship under the preset atmospheric pressure value.

According to the detected results of 1) and 2), at 70 kPa, the equal-loudness multiples corresponding to 20 Hz, 40 Hz, 80 Hz, 160 Hz, 320 Hz . . . 20000 Hz are respectively: $a_1$, $a_2$, $a_3$ . . . $a_n$; and at 80 kPa, the equal-loudness multiples corresponding to 20 Hz, 40 Hz, 80 Hz, 160 Hz, 320 Hz . . . 20000 Hz are respectively: $b_1, b_2, b_3 \ldots b_n$;

4) Storing the frequency response multiple relationship under each preset atmospheric pressure value in the memory.

Optionally, as a possible implementation manner, according to the target frequency response multiple relationship, determining the equal-loudness multiple corresponding to each target frequency point can be achieved through the following process:

For any one of the multiple target frequency points (defined as the first target frequency point), perform the following process:

According to the target frequency response multiple relationship, the frequency point with the smallest difference between the multiple preset frequency points and the first target frequency point is determined as the equivalent frequency point; the equal-loudness multiple corresponding to the equivalent frequency point is determined as the equal loudness multiple corresponding to the first target frequency point.

Continuing the above example, the target atmospheric pressure value is 70 kPa, and the preset frequency points are ⅙ octave frequency points from 20 Hz to 20000 Hz: 20 Hz, 40 Hz, 80 Hz, 160 Hz, 320 Hz . . . 20000 Hz. Assuming that the audio data to be played contains the first target frequency of 42 Hz, the frequency point 40 Hz with the smallest difference from 42 Hz among the preset frequency points is determined as the equivalent frequency point, and the equal-loudness multiple $a_2$ corresponding to the equivalent frequency point of 40 Hz is determined as the equal-response multiple of the first target frequency of 42 Hz.

In the implementation manner, the frequency point with the smallest difference from the first target frequency point among the plurality of preset frequency points is determined as the equivalent frequency point, and the equal-loudness multiple corresponding to the equivalent frequency point is determined as the equal-loudness multiple corresponding to the first target frequency point, which can determine the equivalent frequency point in a limited number of preset frequency points, such that the determined frequency point is closest to the first target frequency point, and the determined equal-loudness multiple of the first target frequency point is more accurate, which in turn makes the amplified multiple of audio data more accurate, and improves the audio playing effect.

Optionally, the frequency response multiple relationship at each preset atmospheric pressure value may be stored in the memory in the form of a table, a matrix, a frequency response curve, or a function, which is not limited herein the present application. In a specific embodiment, the frequency response multiple relationship at each preset atmospheric pressure value is stored in the memory in the form of a two-dimensional array matrix. The preset atmospheric pressure values and the preset frequency points are used as the rows and columns of the two-dimensional array matrix, and the equal-loudness multiples are positioned through the rows and columns. In this way, the arithmetic efficiency of the processing module can be improved.

The effect of the method for playing audio provided by the embodiment of the present application will be described below in conjunction with FIG. 4 to FIG. 7.

Figure 5:
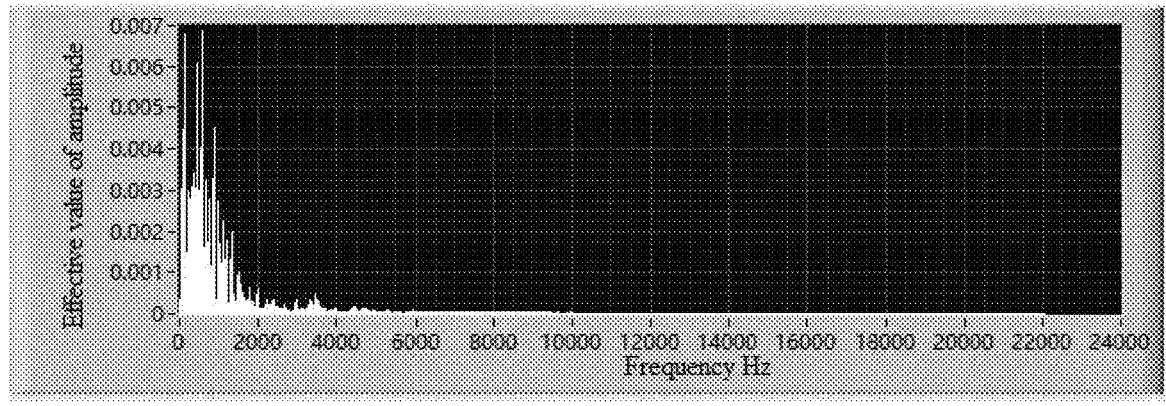
FIG. 5 is a frequency response curve graph of audio to be played under-10 standard atmospheric pressure values provided by an embodiment of the present application.
Figure 6:
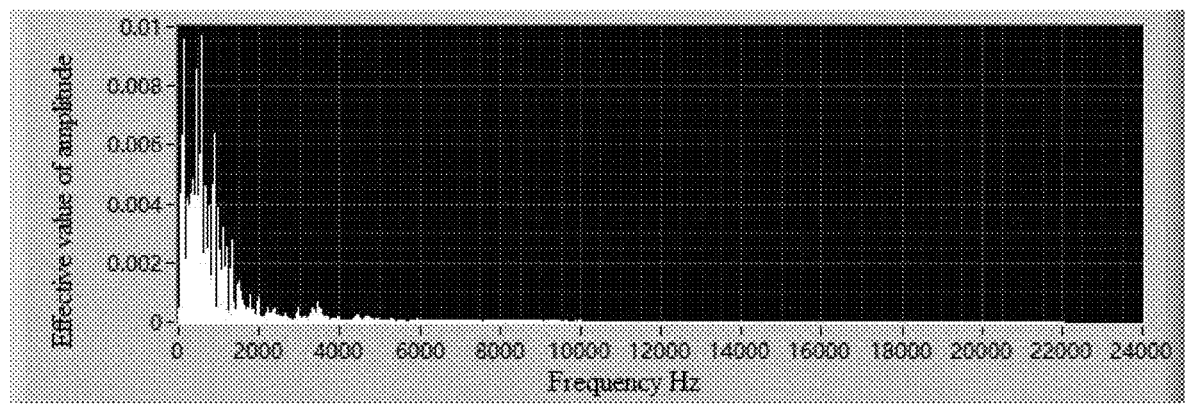
FIG. 6 is a frequency response curve graph of audio to be played of FIGS. 4 and 5 after amplifying according to an embodiment of the present application.
Figure 7:
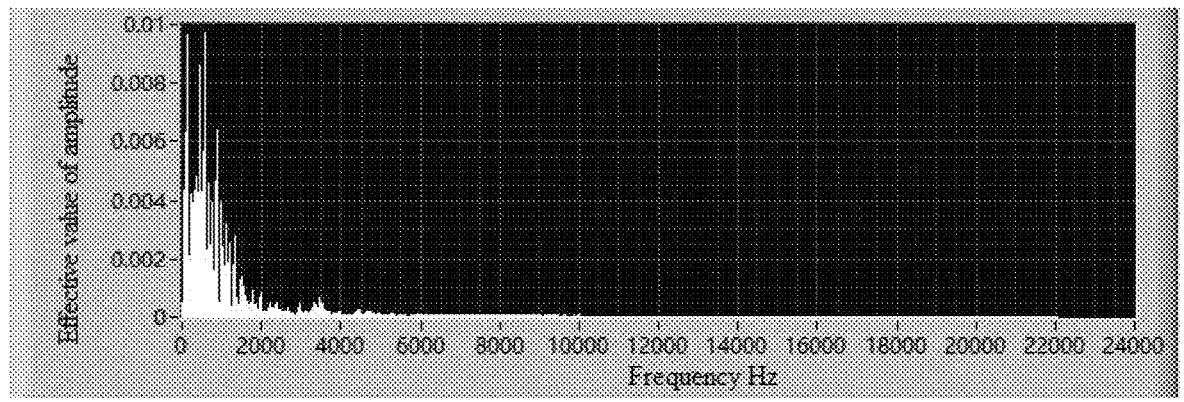
FIG. 7 is a frequency response curve graph of audio to be played under one standard atmospheric pressure value according to an embodiment of the present application.

Exemplarily, FIG. 5 is a frequency response curve graph of audio to be played under −10 standard atmospheric pressure values provided by an embodiment of the present application. FIG. 6 is a frequency response curve graph of audio to be played of FIGS. 4 and 5 after amplifying according to an embodiment of the present application. FIG. 7 is a frequency response curve graph of audio to be played under one standard atmospheric pressure value according to an embodiment of the present application. Specifically, the frequency response curve graphs of the song "I Love You China" are shown in FIGS. 4-7. In FIGS. 4 to 7, the horizontal axis represents the frequency in Hz, and the vertical axis represents the effective value of the amplitude in V. The effective value of the amplitude is used to represent the amount of the loudness. The greater the effective value of the amplitude, the greater the loudness and the greater the sound pressure.

Comparing the FIGS. 4 and 6, it can be seen that when the apparatus for playing audio is applied to 10 standard atmospheric pressure values, after the audio to be played is processed by the method provided in the embodiment of the present application, the effective value of the amplitude of each target frequency point decreases. Therefore, the sound pressure of the output sound is decreased.

Comparing the FIG. 5 and FIG. 6, it can be seen that when the apparatus for playing audio is applied to −10 standard atmospheric pressure values, after the audio to be played is amplified by the method provided in the embodiment of the present application, the effective value of the amplitude of each target frequency point increases. Therefore, the sound pressure of the output sound is increased.

At the same time, comparing the FIG. 6 and FIG. 7, it can be seen that after the audio to be played is amplified by the method provided in the embodiment of the present application, the sound pressure of each target frequency point is almost equal to the effective value of the amplitude under one standard atmospheric pressure value. Therefore, the sound pressure of the output sound is almost the same.

It can be seen that by using the method provided in the embodiment to play the audio to be played can adjust the loudness and sound pressure in various atmospheric pressure environments, so that the playing of the audio to be played in various atmospheric pressure environments is equal to the loudness under standard atmospheric pressure, and the playing effect is improved.

Figure 8:
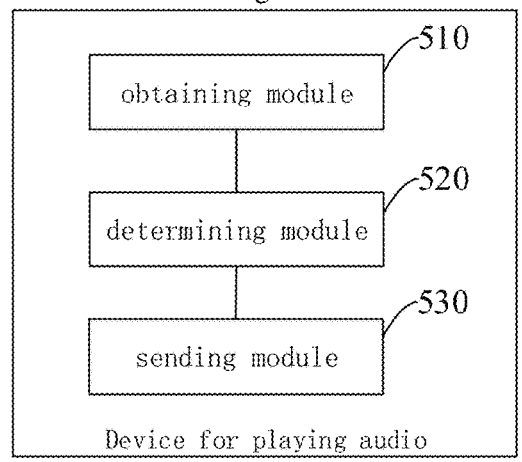
FIG. 8 is a schematic structural diagram of a device for playing audio provided by an embodiment of the present application.

FIG. 8 shows a structural block diagram of a device for playing audio provided by an embodiment of the present application. As shown in FIG. 8, the device for playing audio provided in the embodiment may include:

an obtaining module 510, configured for obtaining an ambient atmospheric pressure value and audio data to be played;

a determining module 520, configured for obtaining multiple target frequency points contained in the audio data to be played when the ambient atmospheric pressure value meets a preset condition, and determining equal-loudness multiples corresponding to the target frequency points according to the ambient atmospheric pressure value and a preset calibration atmospheric pressure value; and a sending module 530, configured for sending the audio data to be played and the equal-loudness multiples of the target frequency points to a power amplifying module, such that the power amplifying module amplifies the audio data to be played according to the equal-loudness multiples corresponding to the target frequency points.

In an embodiment, the determining module 520 is specifically configured for obtaining a target frequency response multiple relationship according to the ambient atmospheric pressure value, the target frequency response multiple relationship being configured for representing an one-to-one correspondence relationship between multiple preset frequency points and multiple equal-loudness multiples under a target atmospheric pressure value, wherein each equal-loudness multiple refers to a multiple value of loudness of audio at the preset frequency point under the target atmospheric pressure value and loudness of audio at the preset frequency point under the preset calibration atmospheric pressure value; and determining an equal-response multiple corresponding to each of the target frequency points according to the target frequency response multiple relationship.

In an embodiment, the determining module 520 is specifically configured for obtaining frequency response multiple relationships under multiple preset atmospheric pressure values, respectively; and determining a preset atmospheric pressure value with a smallest difference between the multiple preset atmospheric pressure values and the ambient atmospheric pressure value as the target atmospheric pressure value, and determining a frequency response multiple relationship under the target atmospheric pressure value as the target frequency response multiple relationship.

In an embodiment, the determining module 520 is specifically configured for determining a frequency point with a smallest difference between the multiple preset frequency points and a first target frequency point as an equivalent frequency point, and determining an equal-loudness multiple corresponding to the equivalent frequency point as an equal-loudness multiple corresponding to the first target frequency point, wherein the first target frequency point is any one of the multiple target frequency points.

In an embodiment, the determining module 520 is specifically configured for performing Fourier transform processing on the audio data to be played to obtain audio frequency domain data; and determining multiple target frequency points contained in the audio data to be played according to the audio frequency domain data.

In an embodiment, the preset condition is that the ambient atmospheric pressure value is greater than a first preset atmospheric pressure value or less than a second preset atmospheric pressure value, wherein, the first preset atmospheric pressure value is greater than the preset calibration atmospheric pressure value, and the second preset atmospheric pressure value is less than the preset calibration atmospheric pressure value.

In an embodiment, the preset calibration atmospheric pressure value is a standard atmospheric pressure value.

The device for playing audio provided in the embodiment is configured to execute the method for playing audio provided in the method embodiment of the present application, the technical principles and technical effects are similar. For details, referring to the embodiments of the method above, which is not be repeated herein.

It can be clearly understood by those skilled in the art that, for describing conveniently and concisely, dividing of the aforesaid various functional units, functional modules is described exemplarily merely, in an actual application, the aforesaid functions can be assigned to different functional units and functional modules to be accomplished, that is, an inner structure of a data synchronizing device is divided into functional units or modules so as to accomplish the whole or a part of functionalities described above. The various functional units, modules in the embodiments can be integrated into a processing unit, or each of the units exists independently and physically, or two or more than two of the units are integrated into a single unit. The aforesaid integrated unit can by either actualized in the form of hardware or in the form of software functional units. In addition, specific names of the various functional units and modules are only used for distinguishing from each other conveniently, but not intended to limit the protection scope of the present application. Regarding a specific working process of the units and modules in the aforesaid device, reference can be made to a corresponding process in the aforesaid method embodiments, which is not repeated herein.

One of the embodiments of the present application further provides an apparatus for playing audio, as shown in FIG. 1, the apparatus for playing audio includes at least one processor, a memory, and a computer program stored in the memory and capable of running on the at least one processor, and when the processor executes the computer program, any step on the embodiments of the method for playing audio described above is implemented.

One of the embodiments of the present application further provides a computer-readable storage medium, the computer-readable storage medium stores a computer program, and the computer program implements any step on the embodiments of the method for playing audio described above when the computer program is executed by the processor.

Those skilled in the art can understand that any reference to memory, storage, database or other media used in the embodiments provided in the present application may include non-volatile and/or volatile memory. The non-volatile memory may include a read only memory (ROM), a programmable ROM (PROM), an electrically programmable ROM (EPROM), an electrically erasable programmable ROM (EEPROM), or a flash memory. The volatile memory may include a random access memory (RAM) or an external cache memory. As an illustration and not a limitation, RAM is available in many forms, such as a static RAM (SRAM), a dynamic RAM (DRAM), a synchronous DRAM (SDRAM), a double data rate SDRAM (DDRSDRAM), an enhanced SDRAM (ESDRAM), a Synchlink DRAM (SLDRAM), a Rambus direct RAM (RDRAM), a direct Rambus dynamic RAM (DRDRAM), and a Rambus dynamic RAM (RDRAM), etc.

As stated above, the aforesaid embodiments are only intended to explain but not to limit the technical solutions of the present application. Although the present application has been explained in detail with reference to the above-described embodiments, it should be understood for the ordinary skilled one in the art that, the technical solutions described in each of the above-described embodiments can still be amended, or some technical features in the technical solutions can be replaced equivalently; these amendments or equivalent replacements won't make the essence of corresponding technical solution to be broken away from the spirit and the scope of the technical solution in various embodiments of the present application.

The embodiments of the invention in which an exclusive property of privilege is claimed are defined as follows:

1. A method for playing audio, comprising:
    obtaining an ambient atmospheric pressure value and audio data to be played;
    obtaining multiple target frequency points contained in the audio data to be played when the ambient atmospheric pressure value meets a preset condition, and determining equal-loudness multiples corresponding to the target frequency points according to the ambient atmospheric pressure value and a preset calibration atmospheric pressure value; and
    sending the audio data to be played and the equal-loudness multiples of the target frequency points to a power amplifying module, such that the power amplifying module amplifies the audio data to be played according to the equal-loudness multiples corresponding to the target frequency points.

2. The method according to claim 1, wherein the step of determining equal-loudness multiples corresponding to the target frequency points according to the ambient atmospheric pressure value and a preset calibration atmospheric pressure value comprises:
    obtaining a target frequency response multiple relationship according to the ambient atmospheric pressure value, the target frequency response multiple relationship being configured for representing an one-to-one correspondence relationship between multiple preset frequency points and multiple equal-loudness multiples under a target atmospheric pressure value, wherein each equal-loudness multiple refers to a multiple value of loudness of audio at the preset frequency point under the target atmospheric pressure value and loudness of audio at the preset frequency point under the preset calibration atmospheric pressure value; and
    determining an equal-response multiple corresponding to each of the target frequency points according to the target frequency response multiple relationship.

3. The method according to claim 2, wherein the step of obtaining a target frequency response multiple relationship according to the ambient atmospheric pressure value comprises:
    obtaining frequency response multiple relationships under multiple preset atmospheric pressure values, respectively; and
    determining a preset atmospheric pressure value with a smallest difference between the multiple preset atmospheric pressure values and the ambient atmospheric pressure value as the target atmospheric pressure value, and determining a frequency response multiple relationship under the target atmospheric pressure value as the target frequency response multiple relationship.

4. The method according to claim 3, wherein the preset condition is that the ambient atmospheric pressure value is greater than a first preset atmospheric pressure value or less than a second preset atmospheric pressure value, wherein, the first preset atmospheric pressure value is greater than the preset calibration atmospheric pressure value, and the second preset atmospheric pressure value is less than the preset calibration atmospheric pressure value.

5. The method according to claim 3, wherein the preset calibration atmospheric pressure value is a standard atmospheric pressure value.

6. The method according to claim 2, wherein the step of determining an equal-response multiple corresponding to each of the target frequency points according to the target frequency response multiple relationship comprises:
    determining a frequency point with a smallest difference between the multiple preset frequency points and a first target frequency point as an equivalent frequency point, and determining an equal-loudness multiple corresponding to the equivalent frequency point as an equal-loudness multiple corresponding to the first target frequency point, wherein the first target frequency point is any one of the multiple target frequency points.

7. The method according to claim 6, wherein the preset condition is that the ambient atmospheric pressure value is greater than a first preset atmospheric pressure value or less than a second preset atmospheric pressure value, wherein, the first preset atmospheric pressure value is greater than the preset calibration atmospheric pressure value, and the second preset atmospheric pressure value is less than the preset calibration atmospheric pressure value.

8. The method according to claim 6, wherein the preset calibration atmospheric pressure value is a standard atmospheric pressure value.

9. The method according to claim 2, wherein the preset condition is that the ambient atmospheric pressure value is greater than a first preset atmospheric pressure value or less than a second preset atmospheric pressure value, wherein, the first preset atmospheric pressure value is greater than the preset calibration atmospheric pressure value, and the second preset atmospheric pressure value is less than the preset calibration atmospheric pressure value.

10. The method according to claim 2, wherein the preset calibration atmospheric pressure value is a standard atmospheric pressure value.

11. The method according to claim 1, wherein the step of obtaining multiple target frequency points contained in the audio data to be played comprises:
    performing Fourier transform processing on the audio data to be played to obtain audio frequency domain data; and
    determining multiple target frequency points contained in the audio data to be played according to the audio frequency domain data.

12. The method according to claim 11, wherein the preset condition is that the ambient atmospheric pressure value is greater than a first preset atmospheric pressure value or less than a second preset atmospheric pressure value, wherein, the first preset atmospheric pressure value is greater than the preset calibration atmospheric pressure value, and the second preset atmospheric pressure value is less than the preset calibration atmospheric pressure value.

13. The method according to claim 11, wherein the preset calibration atmospheric pressure value is a standard atmospheric pressure value.

14. The method according to claim 1, wherein the preset condition is that the ambient atmospheric pressure value is greater than a first preset atmospheric pressure value or less than a second preset atmospheric pressure value, wherein, the first preset atmospheric pressure value is greater than the preset calibration atmospheric pressure value, and the second preset atmospheric pressure value is less than the preset calibration atmospheric pressure value.

15. The method according to claim 1, wherein the preset calibration atmospheric pressure value is a standard atmospheric pressure value.

16. An apparatus for playing audio, comprising: a memory, a processor, and a computer program stored in the memory and capable of running on the processor, and when the processor executes the computer program, following steps are implemented;
   obtaining an ambient atmospheric pressure value and audio data to be played;
   obtaining multiple target frequency points contained in the audio data to be played when the ambient atmospheric pressure value meets a preset condition, and determining equal-loudness multiples corresponding to the target frequency points according to the ambient atmospheric pressure value and a preset calibration atmospheric pressure value; and
   sending the audio data to be played and the equal-loudness multiples of the target frequency points to a power amplifying module, such that the power amplifying module amplifies the audio data to be played according to the equal-loudness multiples corresponding to the target frequency points.

17. The apparatus according to claim 16, wherein the processor comprising:
   an obtaining module, configured for obtaining an ambient atmospheric pressure value and audio data to be played;
   a determining module, configured for obtaining multiple target frequency points contained in the audio data to be played when the ambient atmospheric pressure value meets a preset condition, and determining equal-loudness multiples corresponding to the target frequency points according to the ambient atmospheric pressure value and a preset calibration atmospheric pressure value; and
   a sending module, configured for sending the audio data to be played and the equal-loudness multiples of the target frequency points to a power amplifying module, such that the power amplifying module amplifies the audio data to be played according to the equal-loudness multiples corresponding to the target frequency points.

18. A non-transitory computer-readable storage medium, wherein the computer-readable storage medium stores a computer program, and the computer program implements following steps when the computer program is executed by a processor;
   obtaining an ambient atmospheric pressure value and audio data to be played;
   obtaining multiple target frequency points contained in the audio data to be played when the ambient atmospheric pressure value meets a preset condition, and determining equal-loudness multiples corresponding to the target frequency points according to the ambient atmospheric pressure value and a preset calibration atmospheric pressure value; and
   sending the audio data to be played and the equal-loudness multiples of the target frequency points to a power amplifying module, such that the power amplifying module amplifies the audio data to be played according to the equal-loudness multiples corresponding to the target frequency points.

* * * * *